(12) United States Patent
Shimizu (10) Patent No.: US 8,076,583 B2
(45) Date of Patent: Dec. 13, 2011

(54) LIGHT-TRANSMITTING ELECTRIC CONDUCTOR, METHOD OF MANUFACTURING THE SAME, DESTATICIZING SHEET, AND ELECTRONIC DEVICE

(75) Inventor: Keisuke Shimizu, Kanagawa (JP)

(73) Assignee: Sony Corporation, Tokyo (JP)

( * ) Notice: Subject to any disclaimer, the term of this patent is extended or adjusted under 35 U.S.C. 154(b) by 164 days.

(21) Appl. No.: 12/476,786

(22) Filed: Jun. 2, 2009

(65) Prior Publication Data

US 2009/0305055 A1 Dec. 10, 2009

(30) Foreign Application Priority Data

Jun. 4, 2008 (JP) ................. 2008-146780

(51) Int. Cl.
*H01B 5/14* (2006.01)
(52) U.S. Cl. .................................. 174/126.4
(58) Field of Classification Search .............. 174/126.4
See application file for complete search history.

(56) References Cited

U.S. PATENT DOCUMENTS

| | | | | |
|---|---|---|---|---|
| 2006/0102460 | A1* | 5/2006 | Bourdelais et al. | 200/512 |
| 2008/0088219 | A1* | 4/2008 | Yoon et al. | 313/326 |
| 2008/0286559 | A1* | 11/2008 | Lee et al. | 428/323 |

FOREIGN PATENT DOCUMENTS

| | | |
|---|---|---|
| JP | 2004-230690 | 8/2004 |
| JP | 2006-519712 | 8/2006 |

OTHER PUBLICATIONS

Lee et al., Nature nanotechnology, 2006, 1, p. 66.
Q. Cao et al., Advance Materials, 2006, 18, p. 304.
Y. Zhou et al., Applied Physics Letters, 2006, 88, p. 123109.

* cited by examiner

*Primary Examiner* — Chau Nguyen
(74) *Attorney, Agent, or Firm* — K&L Gates LLP (57) ABSTRACT

Disclosed herein is a light-transmitting electric conductor including, on a surface of a light-transmitting support, a conductive material in which a multiplicity of carbon nanolinear structures are accumulated in two dimensions while making partial contact with each other, wherein the conductive material is a light-transmitting conductive material composed only of the carbon nanolinear structures, and direct bonds are formed between the surface of the light-transmitting support and the carbon nanolinear structures making contact with the surface, and between the carbon nanolinear structures making contact with each other.

27 Claims, 6 Drawing Sheets

LIGHT-TRANSMITTING ELECTRIC CONDUCTOR, METHOD OF MANUFACTURING THE SAME, DESTATICIZING SHEET, AND ELECTRONIC DEVICE

CROSS REFERENCES TO RELATED APPLICATIONS

The present application claims priority to Japanese Priority Patent Application JP 2008-146780 filed in the Japan Patent Office on Jun. 4, 2008, the entire content of which is hereby incorporated by reference.

BACKGROUND

The present application relates to a light-transmitting electric conductor excellent in light-transmitting property and electrically conductive property, a method of manufacturing the same, a destaticizing sheet, and an electronic device. More particularly, the application relates to a light-transmitting electric conductor which uses carbon nanolinear (nanofilamentous) structures such as carbon nanotubes, and a method of manufacturing the same.

Transparent conductive films have been used as transparent electrodes for electronic apparatuses involving entrance/exit of light, such as liquid crystal display s and touch panels, destaticizing films for light-transmitting members on which deposition of dust is undesirable, such as partitions in clean rooms. As a material for such transparent conductive films, there have been used, for example, inorganic oxides such as indium tin oxide (ITO) and inorganic fluorides such as fluorine-doped tin oxide (FTO). These oxides and fluorides, however, are hard and brittle, and liable to crack or be exfoliated even with slight bending or deflection; thus, they are poor in machinability. In addition, indium is not abundant and will possibly be deficient in future, on a resource basis.

As other conductive material than the inorganic oxides and fluorides, there have been proposed conductive resin compositions in which conductive particulates such as those of metal or carbon are dispersed in a binder resin. Such conductive resin compositions, however, are poor in light-transmitting property and are not suited to uses where transparency is required.

On the other hand, carbon nanotubes, the existence of which was discovered in 1991, have been attracting attention because of their peculiar electrical characteristics of turning to be metallic or semiconducting depending on small changes in structure, as well as their mechanical characteristics of being flexible and tough. Therefore, basic researches and applied researches of carbon nanotubes have been made vigorously. In recent years, as one of the applied researches, there have been proposed transparent conductive films in which metallic carbon nanotube is used as a conductive material, paying attention to its extremely high electroconductive property, and methods for producing these films.

For example, Japanese Patent Laid-Open No. 2004-230690 (Claim 1, pp. 3-6, Table 1, hereinafter referred to as Patent Document 1) proposes an antistatic transparent resin plate in which an antistatic layer having carbon nanotubes contained in a transparent thermoplastic resin is formed on at least one side of a transparent thermoplastic resin substrate. It is described in Patent Document 1 that carbon nanotubes in a discrete (non-entangled) state in the antistatic layer or bundles each composing of a plurality of carbon nanotubes and being in a discrete (non-entangled) state are dispersed in the thermoplastic resin while making contact with one another. The antistatic layer is formed by coating the substrate with a coating liquid containing a powder of the thermoplastic resin, the carbon nanotubes, and a dispersant.

In the configuration of the antistatic layer and the production method as above-mentioned, however, mutual contact of the carbon nanotubes is obstructed by the dispersant, making it very difficult to utilize the excellent electroconductive property intrinsic of the carbon nanotubes. Therefore, in order to obtain a desired electroconductivity, it may be necessary to add a large amount of carbon nanotubes, which would cause a lowering in transparency. Besides, it is difficult to uniformly disperse the carbon nanotubes in the thermoplastic resin, so that it may be impossible to obtain a uniform electroconductive property in the antistatic layer.

Taking this into consideration, Japanese Patent Laid-Open No. 2006-519712 (Claims 1 and 2, pp. 6-11, FIGS. 2 and 4, hereinafter referred to as Patent Document 2) proposes a conductive molded body including a substrate, and a conductive layer which is formed on a surface of the substrate and which contains thin conductive fibers dispersed therein. In this conductive molded body, at least some portions of the conductive fibers are fixed (anchored) to the substrate, while at least other portions of the conductive fibers are protruding from the outermost surface of the conductive layer, and the conductive fibers are making electrical contact with each other at their portions protruding from the outermost surfaces or at their portions fixed to the substrate.

In Example 1 of Patent Document 2, an example of production of the above-mentioned conductive molded body is shown in which after the conductive layer is formed in the same manner as the antistatic layer in Patent Document 1, the conductive layer is subjected to hot pressing so that springback forces of the carbon nanotubes cause the carbon nanotubes to protrude from the surface of the thermoplastic resin layer. In this example, the surface resistivity of the conductive layer was lowered from $2.4 \times 10^{11} \Omega/\square$ to $7.7 \times 10^{7} \Omega/\square$ through the hot pressing. Patent Document 2 describes that the reason for the lowering in surface resistivity is as follows. In the conductive layer yet to be hot pressed, the carbon nanotubes are buried in the thermoplastic resin layer. In the conductive layer having been hot pressed, on the other hand, portions of the carbon nanotubes are protruding from the thermoplastic resin layer. When the protruding portions of the carbon nanotubes touch each other in the outside of the thermoplastic resin layer, the electric insulator (thermoplastic resin) is not present between the mutually touching carbon nanotubes, so that the resistance between the carbon nanotubes is lowered.

Besides, in Example 2 of Patent Document 2, an example of production of the conductive molded body is shown in which a polyethylene terephthalate (PET) film is coated with a coating liquid prepared by mixing single-wall carbon nanotubes and a dispersant (a polyoxyethylene-polyoxypropylene copolymer) into a mixed solvent of isopropyl alcohol and water. After a conductive material composed only of the carbon nanotubes and the dispersant is thus formed, a urethane acrylate solution is applied thereto, whereby joints between the surface of the PET film and the carbon nanotubes making contact with the surface are covered with a urethane acrylate resin layer. In this example, the content of the carbon nanotubes in the coating liquid was 0.003 mass %, and the content of the dispersant was 0.05 mass %.

An application of the semiconductor characteristics of semiconducting carbon nanotubes is described, for example, in M. Lee et al., Nature nanotechnology, 2006, 1, 66 (hereinafter referred to as Non-Patent Document 1). In this example, a conductive layer composed only of single-wall carbon nanotubes is formed, and a transistor of a field effect transistor (FET) structure in which the conductive layer is used as a channel layer and a substance sensor utilizing the same are fabricated. Non-Patent Document 1 shows a method of forming the conductive layer wherein a substrate is immersed in a dispersion of the single-wall carbon nanotubes in 1,2-dichlorobenzene, and the single-wall carbon nanotubes are adhered to the substrate by utilizing the affinity between the single-wall carbon nanotubes and the substrate. Besides, the Non-Patent Document 1 describes that the single-wall carbon nanotubes show strong affinity for exposed surfaces of most of substrate materials, and that examples of such substrate materials include gold, silicon dioxide, glass, silicon, and aluminum.

In addition, Q. Cao et al., Advanced Materials, 2006, 18, 304 (hereinafter referred to as Non-Patent Document 2) shows an example of fabrication of a transparent and flexible thin film transistor (TFT). In this example, a method is adopted in which carbon nanotubes are formed on a silicon oxide layer on a surface of a silicon wafer by a chemical vapor deposition (CVD) technique, and the carbon nanotubes thus formed are transfer printed onto a photo-curing epoxy pressure sensitive adhesive layer formed on a PET film. By using this method, a gate electrode, a semiconductor layer, and source and drain electrodes are formed, whereby all the other members than a gate insulator layer of the TFT are formed by use of the carbon nanotubes.

Further, Y. Zhou et al., Applied Physics Letters, 2006, 88, 123109 (hereinafter referred to as Non-Patent Document 3) proposes a method for forming a conductive material in which carbon nanotubes are distributed uniformly. In this method, a dispersion of carbon nanotubes is filtrated through a filter, and the carbon nanotubes deposited uniformly on the filter are transferred onto a transparent substrate.

SUMMARY

Carbon nanolinear structures include those which show an extremely high electroconductive property, starting with metallic carbon nanotubes. In addition, the carbon nanolinear structures include those showing excellent semiconductor properties, such as semiconducting carbon nanotubes. For the unique electroconductive property of the carbon nanolinear structures to be exhibited sufficiently, it is desirable that other substances present intermediately between the carbon nanotubes to spoil the electroconductive property of the carbon nanotubes, such as a binder resin and a dispersant, are as little as possible, as has been above-mentioned by showing examples.

The antistatic layer described in Patent Document 1 contains the thermoplastic resin and the dispersant in addition to carbon nanotubes, and, therefore, the electroconductivity between the carbon nanotubes is damaged by these other components. In the conductive layer shown in Example 1 of Patent Document 2, although the thermoplastic resin is absent between the carbon nanotubes protruding from the surface of the thermoplastic resin layer, the thermoplastic resin and the dispersant are present intermediately between the carbon nanotubes buried in the thermoplastic resin layer, in the same manner as in the antistatic layer shown in Patent Document 1. In the case of this conductive layer, therefore, the electroconductivity between the carbon nanotubes is again damaged.

In the conductive layer shown in Example 2 of Patent Document 2, the urethane acrylate resin layer is formed after the formation of the conductive material composed only of the carbon nanotubes and the dispersant. Therefore, there is little possibility that the urethane acrylate resin might penetrate into gaps between the carbon nanotubes, thereby spoiling the electroconductivity between the carbon nanotubes. However, since the conductive material contains the dispersant in a mass of about 17 times that of the carbon nanotubes, it is highly possible for the dispersant to be present intermediately between the carbon nanotubes, thereby degrading the electroconductivity between the nanotubes. In addition, since the conductive material is formed by a coating method, the carbon nanotubes are liable to aggregate together at the time of evaporation of the solvent, resulting in the formation of a conductive material in which the carbon nanotubes are distributed nonuniformly.

The conductive layer shown in Non-Patent Document 1 is composed only of single-wall carbon nanotubes (SWNTs) which are distributed uniformly. In this case, therefore, the above-mentioned problems are not generated. In this document, however, the utilization of semiconducting carbon nanotubes is only investigated, and no study is made on the utilization of metallic carbon nanotubes. Besides, no investigation is made there on the light-transmitting property of the device including the substrate. As for the affinity between the single-wall carbon nanotubes and the substrate, also, nothing but the above-mentioned is described in the Non-Patent Document 1. Thus, this Non-Patent Document 1 does not contain any investigation from the viewpoint of a light-transmitting conductor and a method of producing the same.

The conductive layer shown in Non-Patent Document 2 is also composed only of single-wall carbon nanotubes (SWNTs) distributed uniformly, and has a light-transmitting nature, as emphasized in the Non-Patent Document 2. In the fabrication method shown in the Non-Patent Document 2, however, the SWNT layer is adhered to an epoxy pressure sensitive adhesive layer by transfer, so that the number of layers laminated is increased and light-transmitting property is lowered accordingly. In addition, since the SWNT layer to be transferred is formed by a CVD method, it is difficult to achieve scale-up and it is very difficult to produce a large-area light-transmitting conductor which is uniform in characteristics. Non-Patent Document 3 describes a method of forming a conductive material wherein carbon nanotubes in a dispersion are uniformly deposited on a filter and the deposited mass of carbon nanotubes is transferred. This approach has a drawback in that the film forming process is very intricate and the film would very likely contain a large amount of impurities.

Thus, there is a need for a light-transmitting conductor which has a conductive material including carbon nanolinear structures such as carbon nanotubes and of which light-transmitting property and electroconductive property can be exhibited without being degraded, a manufacturing method therefor which is simple and easy to scale up, a destaticizing sheet using the same, and an electronic device using the same.

The present inventor has made intensive and extensive researches with the intention of solving the above-mentioned problems, and, as a result of the researches, has found out that, when carbon nanotubes are dispersed in a solvent poorer in affinity for the carbon nanotubes than a surface of a light-transmitting support and the light-transmitting support is immersed in the resulting dispersion, the carbon nanotubes are spontaneously adsorbed on the surface of the light-transmitting support. The present application is based on the findings of this research according to an embodiment.

According to an embodiment, there is provided a light-transmitting electric conductor including, on a surface of a light-transmitting support, a conductive material in which a multiplicity of carbon nanolinear structures are accumulated in two dimensions while making partial contact with each other, wherein the conductive material is a light-transmitting conductive material composed only of the carbon nanolinear structures, and direct bonds are formed between the surface of the light-transmitting support and the carbon nanolinear structures making contact with the surface, and between the carbon nanolinear structures making contact with each other.

According to another embodiment, there is provided a method of manufacturing a light-transmitting electric conductor, the light-transmitting electric conductor including, on a surface of a light-transmitting support, a conductive material in which a multiplicity of carbon nanolinear structures are accumulated in two dimensions while making partial contact with each other, the conductive material being a light-transmitting conductive material composed only of the carbon nanolinear structures, and direct bonds being formed between the surface of the light-transmitting support and the carbon nanolinear structures making contact with the surface, and between the carbon nanolinear structures making contact with each other, wherein the method includes performing a series of steps a predetermined number of times, the series of steps including: immersing the light-transmitting support in a dispersion of the carbon nanolinear structures in a dispersing solvent for a predetermined time so as to adsorb the carbon nanolinear structures onto the surface of the light-transmitting support; washing the surface of the light-transmitting support, taken out of the dispersion, with a washing solvent so as to remove those carbon nanolinear structures which are not adsorbed on the surface; and evaporating the dispersing solvent and the washing solvent so as to fix the adsorbed carbon nanolinear structures.

According to a further embodiment, there is provided a destaticizing sheet including the light-transmitting electric conductor according to the one embodiment of the application. According to yet another embodiment, there is provided an electronic device provided with the light-transmitting electric conductor according to an embodiment of the application.

The carbon nanolinear structure in an embodiment is a single-wall carbon nanotube or a double- or multi-wall carbon nanotube, and, more generally, includes those materials which are not so high as the carbon nanotubes in crystallinity (orderedness of atomic arrangement). Specifically, the carbon nanolinear structure may be any carbonaceous material that has a configuration in which the whole part or a part of a rolled up graphene sheet structure is contained as an electroconductive region, the graphene sheet structure has a nanolinear (nanofilamentous) outside shape with a sectional size of several nanometers to several tens of nanometers, the motions of electrons in the sectional directions are limited to within a nanosize range, and only the electron motions in the longitudinal direction (axial direction) of the structure are allowed on a macroscopic scale. The outside shape may be a straight line shape or a curve shape, and may include branches and/or nodes. To be more specific, examples of the carbon nanolinear structures include not only cylindrical carbon nanotubes but also cup stack type carbon nanotubes, carbon nanohorns, carbon nanobamboos, vapor-phase-grown carbon nanofibers (for example, VGCF produced by Showa Denko K.K.), and carbon nanowires.

In the light-transmitting electric conductor according to an embodiment, the conductive material in which a multiplicity of carbon nanolinear structures are accumulated in two dimensions while making partial contact with each other is provided directly on a surface of the light-transmitting support. The carbon nanolinear structures permit easy transmission therethrough of visible light because their diameters are by far smaller than the wavelengths of visible rays. Moreover, in the thickness direction of the conductive material (the direction perpendicular to the surface of the light-transmitting support), usually, either one or no carbon nanolinear structure is present, and only a few carbon nanolinear structures are overlapping with each other; therefore, the conductive material is high in visible light transmitting property. In the light-transmitting electric conductor according to an embodiment, only the light-transmitting support is present as a body other than the conductive material that might impede transmission of visible light. This ensures that the high visible light transmitting property of the conductive material can be made the most of.

In addition, the conductive material is composed only of the carbon nanolinear structures, and the carbon nanolinear structures making contact with one another are directly bonded together, without being intervened by a binder resin or a dispersant or the like. In the conductive material, therefore, the characteristics of the carbon nanolinear structures themselves are exhibited without being spoiled. For instance, in the case where the carbon nanolinear structures are composed of metallic carbon nanotubes having an extremely high electroconductivity, the conductive material can show a sufficient electroconductivity while simultaneously showing a high light-transmitting property, even if the surface density of the metallic carbon nanotubes is comparatively low, as will be shown in Examples later. Such a conductive material is suited to use as a transparent electrode. Besides, in the case where the carbon nanolinear structures are composed of semiconducting carbon nanotubes, the conductive material shows excellent semiconductor characteristics and, therefore, can be used as a channel layer of a TFT which is transparent and flexible. Further, in the cases where the carbon nanolinear structures are composed of carbon nanotubes, the mechanical properties peculiar to the carbon nanotubes, i.e., flexibility and toughness, are exhibited as characteristic properties of the conductive material without being spoiled.

In the method of manufacturing a light-transmitting electric conductor according to an embodiment, the light-transmitting support is immersed for a predetermined time in the dispersion of the carbon nanolinear structures in a dispersing solvent, whereby the carbon nanolinear structures are adsorbed on a surface of the light-transmitting support. Then, the surface of the light-transmitting support taken out of the dispersion is washed with a washing solvent to remove those carbon nanolinear structures which are not adsorbed on the surface, after which the adsorbed carbon nanolinear structures are fixed.

According to this manufacturing method, the affinity between the carbon nanolinear structures and the surface of the light-transmitting support is utilized for the process in which the carbon nanolinear structures in the dispersion are spontaneously adsorbed on the surface of the light-transmitting support, and, further, those carbon nanolinear structures which are not adsorbed on the surface are removed in the subsequent washing step. Consequently, only the carbon nanolinear structures adsorbed on the surface of the light-transmitting support are fixed. Therefore, unlike in a coating method in which carbon nanolinear structures are forcibly deposited on a support surface through evaporation of a solvent, the carbon nanolinear structures can be uniformly fixed while maintaining the highly dispersed state they have had in the dispersion, without aggregating together, at the time of evaporation of the solvents.

Besides, in the coating method, all the carbon nanolinear structures contained in the dispersion used for coating are deposited. In the manufacturing method pertaining to an embodiment, on the other hand, even when poorly dispersed carbon nanolinear structures are contained in the dispersion, they will not produce a problem unless they are adsorbed onto the surface of the light-transmitting support. Therefore, the dispersibility (dispersing performance) of the carbon nanolinear structures in the dispersion used in the present manufacturing method may be lower than that of the carbon nanolinear structures in the dispersion used in the coating method. Accordingly, in the case where a suitable solvent can be selected, the dispersion in the present method can be prepared without using any dispersant, so that incorporation of a dispersant into the conductive material is obviated. Besides, even in the case of using a solvent such as to necessitate a dispersant, the amount of the dispersant to be used can be reduced as compared with that in the coating method. Moreover, unlike in the coating method, the dispersant can be removed in the washing step in the present manufacturing method. Therefore, the dispersant is prevented from remaining in the conductive material. Further, even if impurities are contained in the dispersion, the impurities will not produce a problem unless they are adsorbed onto the surface of the light-transmitting support. Moreover, even if the impurities are adsorbed on the surface of the light-transmitting support, they can be removed in the washing step. Accordingly, the impurities are prevented from remaining in the conductive material.

In addition, the carbon nanolinear structures constituting the conductive material are bonded to the surface of the light-transmitting support without fail, and a situation in which carbon nanolinear structures not bonded to the surface of the light-transmitting support are stacked in multiple layers is obviated. Therefore, an upper limit naturally exists in regard of the surface density of the carbon nanolinear structures constituting the conductive material. The surface density of the carbon nanolinear structures adsorbed on the surface of the light-transmitting support can be easily controlled within a range of not more than the upper limit, by appropriately selecting the concentration of the carbon nanolinear structures in the dispersion and the immersion time.

Thus, in the method of manufacturing a light-transmitting electric conductor according to an embodiment, a highly flat conductive material which does not contain any dispersant or impurities and in which carbon nanolinear structures are distributed uniformly can be formed through a method which is simple and permits easy scaling-up. Accordingly, it is possible to produce a light-transmitting electric conductor such that the light-transmitting property, electric conduction characteristics and mechanical characteristics possessed by the carbon nanolinear structures such as carbon nanotubes can be assuredly exhibited without being spoiled.

The destaticizing sheet according to an embodiment is composed of the just-mentioned light-transmitting electric conductor, and the electronic device according to an embodiment of the application is provided with the just-mentioned light-transmitting electric conductor. In the destaticizing sheet and the electronic device, therefore, the excellent characteristics such as light-transmitting property, electric conduction characteristics and mechanical characteristics possessed by the carbon nanolinear structures can be utilized without spoiling.

Additional features and advantages are described in, and will be apparent from, the following Detailed Description and the figures.

DETAILED DESCRIPTION

The present application will be described below in greater detail with reference to the drawings according to an embodiment. In the light-transmitting electric conductor according to an embodiment, preferably, the carbon nanolinear structures are overlapping partly with each other as viewed in the vertical direction. As has been above-mentioned, in the conductive material, a multiplicity of carbon nanolinear structures are basically accumulated in two dimensions while making partial contact with each other, and, normally, either one or no carbon nanolinear structure is present in the thickness direction of the conductive material (the direction perpendicular to the surface of the light-transmitting support). However, most of the carbon nanolinear structures such as carbon nanotubes are in the shape of a meandering or crooked curve, so that in some locations about three carbon nanolinear structures may be overlapping with one another as viewed in the vertical direction (thickness direction).

In addition, preferably, the conductive material has a sheet resistance of 10 to 1,000,000Ω/□ and a visible light transmittance of not less than 70%. With such properties, the conductive material can be suitably used as a transparent electrode or a transparent conductive film.

Besides, preferably, the conductive material forms a transparent electrode. This is the most important use for the conductive material at present.

In the light-transmitting electric conductor and the manufacturing method therefor according to an embodiment, preferably, the carbon nanolinear structure is carbon nanotube. For example, single-wall carbon nanotubes include metallic carbon nanotubes which show an extremely high electroconductivity and semiconducting carbon nanotubes which show excellent semiconductor characteristics. The carbon nanotubes to which an embodiment is applicable are not particularly limited, and metallic carbon nanotubes and semiconducting carbon nanotubes as well as their mixtures can be appropriately used selectively according to the intended use. In addition, double-wall carbon nanotubes and multi-wall carbon nanotubes as well as their mixtures can be selectively used, as required. Further, carbon nanotubes containing fullerene or metallic ions in hollow portions thereof can also be used.

In addition, preferably, the light-transmitting support is a glass plate or a polymer resin plate. In this case, preferably, the surface of the light-transmitting support has been subjected to a treatment for enhancing affinity for the carbon nanolinear structures. For example, preferably, the light-transmitting support is a glass plate having a surface enhanced in hydrophilicity by at least one of an ozone treatment, an ultraviolet treatment in the presence of an ozone gas, and a plasma treatment in the presence of an oxygen gas. Or, preferably, the light-transmitting support is a polymer resin plate which has a surface made hydrophilic by at least one of an ozone treatment, an ultraviolet treatment in the presence of an ozone gas, a corona treatment in the presence of an oxygen gas, a plasma treatment in the presence of an oxygen gas, and a treatment with a silane coupling agent, or which is provided with a hydrophilic layer on a surface thereof.

Besides, correspondingly to the above-mentioned, preferably, the carbon nanolinear structures have been subjected to a treatment for enhancing affinity for the surface of the light-transmitting support. For example, preferably, the carbon nanolinear structures have been made hydrophilic by a heating treatment with at least one of an aqueous hydrogen peroxide solution, nitric acid, and concentrated sulfuric acid.

Further, preferably, a polymer resin layer covering joints between the surface of the light-transmitting support and the carbon nanolinear structures making contact with the surface is provided.

In the method of manufacturing a light-transmitting electric conductor according to an embodiment, preferably, a halogenated hydrocarbon is used as the dispersing solvent.

In the electronic device according to an embodiment, preferably, the conductive material forms a transparent electrode. The conductive material makes it possible to obtain a transparent conductive film which is high in transparency and electroconductivity and excellent in mechanical strength, making the most of the characteristics of the carbon nanolinear structures, so that it can be used for a touch panel and the like. In addition, preferably, the electronic device is configured as a substance sensor wherein the conductive material forms a sensor section. Besides, preferably, the electronic device has the conductive material constituting a thin film transistor. In such a case, the conductive material may form any of a gate electrode, a source electrode and a drain electrode, the conductive material may form a semiconductor layer, or such conductive materials may be used to selectively form all the members other than a gate insulator layer so as to fabricate a transparent and flexible thin film transistor (TFT).

The present application will be more specifically described below referring to the drawings according to an embodiment.

Embodiment 1

In Embodiment 1, mainly, examples of the light-transmitting electric conductors and the methods of manufacturing a light-transmitting electric conductor will be described. In this case, it is assumed that carbon nanotube is used as the carbon nanolinear structure.

Figure 1:
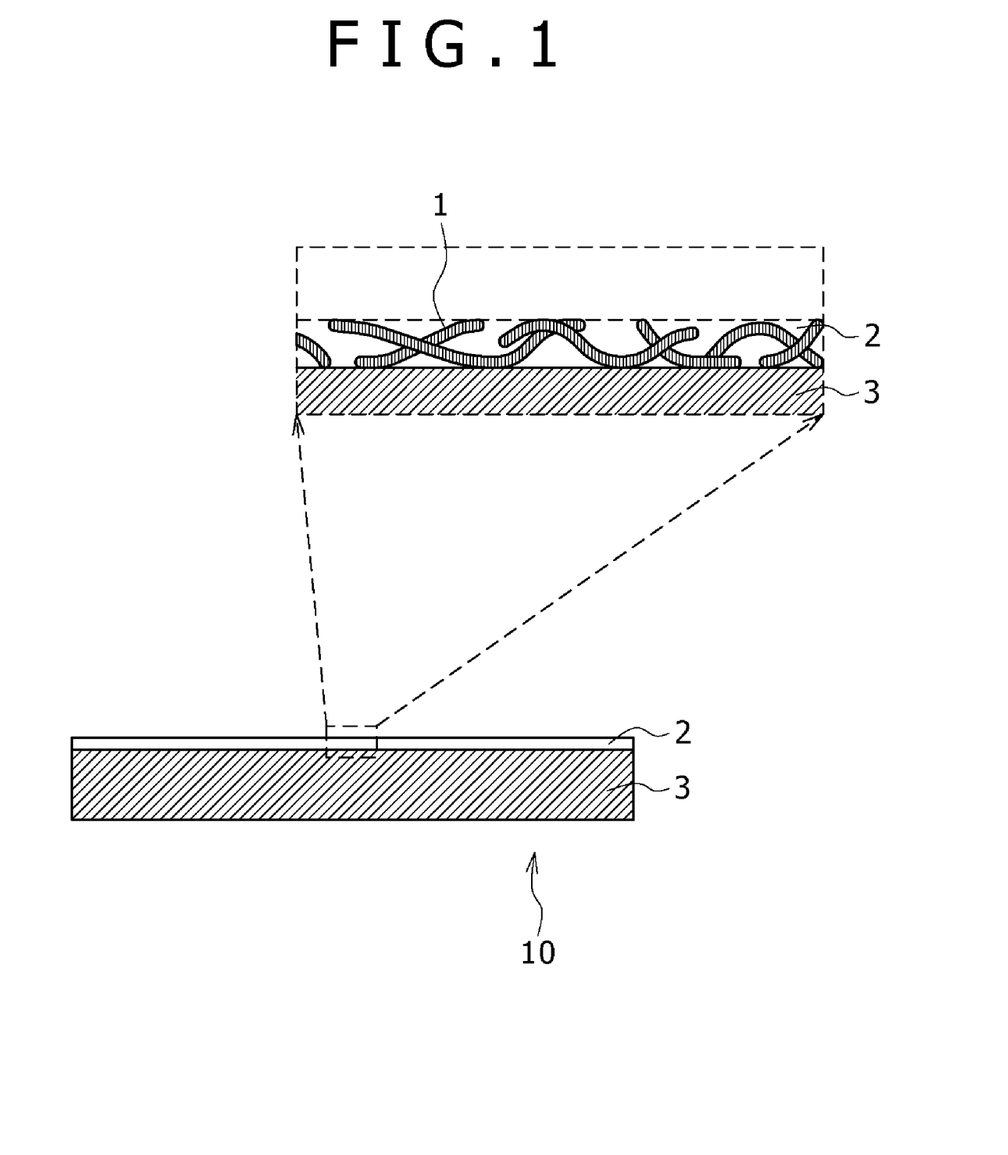
FIG. 1 shows a sectional view and a partial enlarged sectional view illustrating the structure of a light-transmitting electric conductor based on embodiment one.

FIG. 1 shows a sectional view and a partial enlarged sectional view illustrating the structure of a light-transmitting electric conductor 10 based on Embodiment 1. As shown in FIG. 1, in the light-transmitting electric conductor 10, a conductive material 2 in which a multiplicity of carbon nanotubes 1 are accumulated in two dimensions while making partial contact with each other is provided directly on a principal surface on one side of a light-transmitting support 3. The conductive material 2 has a structure in which the carbon nanotubes 1 basically are accumulated in two dimensions and, usually, either one or no carbon nanotube 1 is present in the thickness direction of the conductive material 2 (the direction perpendicular to the surface of the light-transmitting support 3). However, since most of the carbon nanotubes 1 are in the shape of a meandering or crooked curve, in some locations about three carbon nanolinear structures may be overlapping with each other as viewed in the vertical direction (thickness direction).

The carbon nanotubes 1 permits easy transmission therethrough of visible light, since their diameters are by far smaller than the wavelengths of visible rays. Moreover, since either one or no carbon nanotube 1 is usually present in the thickness direction of the conductive material 2, as above-mentioned, and only a few carbon nanotubes 1 at most may be overlapping as viewed in the thickness direction, the conductive material 2 shows a high visible light transmitting property. In the light-transmitting electric conductor 10, only the light-transmitting support 3 is present as a visible light transmission impeding body other than the conductive material 2, and, therefore, it is possible to make the best of the high visible light transmitting property of the conductive material 2.

In addition, the conductive material 2 is composed only of the carbon nanotubes 1, and the carbon nanotubes 1 making contact with one another are bonded directly to one another, without being intervened by a binder resin or a dispersant or the like. Therefore, in the conductive material 2, the characteristics of the carbon nanotubes 1 themselves are exhibited without being spoiled. For instance, in the case where the carbon nanotubes 1 are composed of metallic carbon nanotubes having an extremely high electroconductivity, the conductive material 2 shows a sufficient electroconductivity while simultaneously showing a high light-transmitting property, even if the surface density of the carbon nanotubes 1 is comparatively low, as will be shown in Examples later. With such properties, the conductive material can be suitably used as a transparent electrode or a transparent conductive film. Besides, in the case where the carbon nanotubes 1 are composed of semiconducting carbon nanotubes, the conductive material 2 shows excellent semiconductor characteristics and, therefore, can be used as a channel layer of a light-transmitting TFT. Furthermore, the mechanical characteristics such as flexibility and toughness possessed by the carbon nanotubes 1 are exhibited as properties of the conductive material 2, without being spoiled.

The carbon nanotubes 1 applicable in this embodiment are not particularly limited; metallic carbon nanotubes and semiconducting carbon nanotubes as well as their mixtures, of the single-wall carbon nanotubes, can be appropriately used selectively according to the intended use. In addition, double-wall carbon nanotubes and other multi-wall carbon nanotubes as well as their mixtures can also be selectively used, as required. Further, carbon nanotubes containing fullerene or metallic ions in hollow portions thereof can also be used.

The method for manufacturing the carbon nanotubes 1 is not particularly limited. Specific examples of the manufacturing method include an arc discharge method, a laser ablation method, and CVD methods, inclusive of the HiPco method, which is a kind of CVD method. Preferably, the carbon nanotubes obtained by any of these methods are cleared of impurities by a purifying method such as oxidation, cleaning (washing), filtration, and centrifugal separation, to obtain highly purified carbon nanotubes, which are put to use.

As the light-transmitting support 3, either a glass plate or a polymer resin plate is used. Examples of the material of the polymer resin plate include polyethylene terephthalate (PET) resin, polycarbonate (PC) resin, polymethyl methacrylate (PMMA) resin, polypropylene (PP) resin, polyethylene (PE) resin, polyether sulfone (PES) resin, polyimide (PI) resin, and epoxy resin. The shape of the light-transmitting support 3 is not particularly limited; for example, a film-like or sheet-like shape is adopted, with a thickness of 80 to 300 μm.

FIGS. 2A to 2E show sectional views and partial enlarged sectional views illustrating the flow of steps for manufacturing the light-transmitting electric conductor 10 based on Embodiment 1.

First, the carbon nanotubes are subjected to a treatment for enhancing affinity for a surface of the light-transmitting support 3. For instance, the carbon nanotubes are made hydrophilic by a heating treatment with an aqueous hydrogen peroxide solution. As a treatment for enhancing the hydrophilicity of the carbon nanotube, an oxidizing treatment using an aqueous hydrogen peroxide solution or an acid having an oxidizing power is adopted. Specifically, an aqueous hydrogen peroxide solution, nitric acid, concentrated sulfuric acid, or an acid solution prepared by combining some of them is used. The treatment temperature and the treatment time are not particularly limited. However, these conditions affect the dispersed state of the carbon nanotubes in the solvent used, the amount of the carbon nanotubes deposited on the substrate, the characteristics of the transparent conductive film produced, etc.; therefore, it may be necessary to select optimal conditions for attaining the desired characteristics. Incidentally, a purchased carbon nanotube varies in the number of hydrophilic groups introduced to the carbon nanotube, the number of faults contained in the carbon nanotube, or the like according to the method of synthesis and the method of purification adopted used in their production; therefore, it may be necessary to fully grasp the characteristics of the carbon nanotube and to select optimal treatment conditions.

Figure 2A:
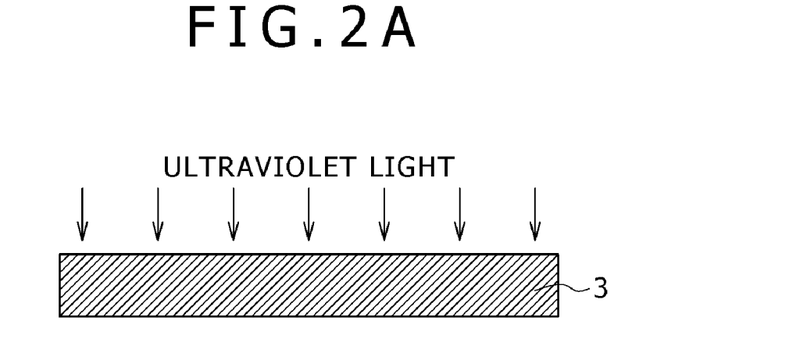
FIGS. 2A to 2E show sectional views and a partial enlarged sectional view illustrating a flow of steps for manufacturing the light-transmitting electric conductor shown in FIG. 1.

Next, as shown in FIG. 2A, the surface of the light-transmitting support 3 is subjected to a treatment for enhancing affinity for the carbon nanolinear structures. The method of the treatment is not particularly limited. For example, correspondingly to the treatment of the carbon nanotubes 1 as above-mentioned, in the case where the light-transmitting support 3 is a glass plate, its surfaces is enhanced in hydrophilicity by at least one of an ozone treatment, an ultraviolet treatment in the presence of an ozone gas, and a plasma treatment in the presence of an oxygen gas. Where the light-transmitting support 3 is a polymer resin plate, on the other hand, its surface is made hydrophilic by at least one of an ozone treatment, an ultraviolet treatment in the presence of an ozone gas, a corona treatment in the presence of an oxygen gas, a plasma treatment in the presence of an oxygen gas, and a treatment with a silane coupling agent, or a hydrophilic layer such as a silicon oxide layer and an alumina layer is formed on the surface by at least one of a chemical vapor deposition method (CVD method), a sputtering method, and a vapor deposition method.

Figure 2B:
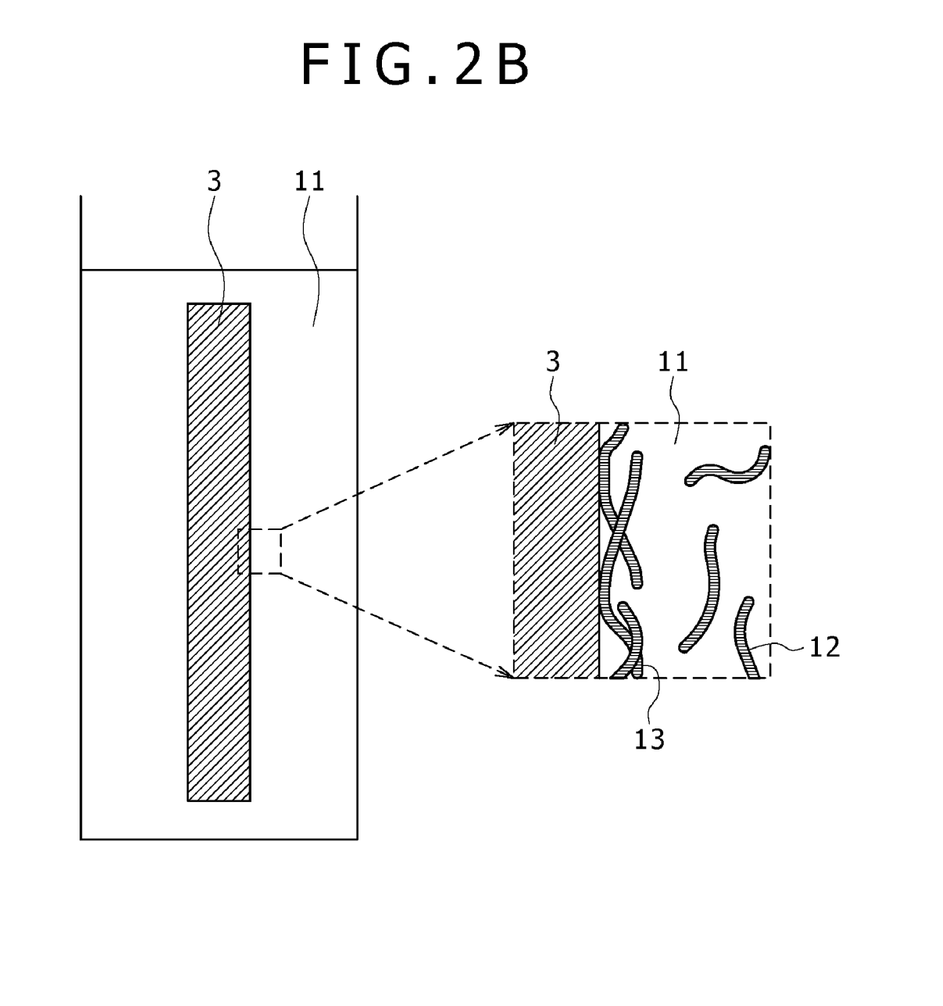

Subsequently, as shown in FIG. 2B, the light-transmitting support 3 is immersed in a carbon nanotube dispersion 11. A dispersing solvent used for preparation of the dispersion 11 is desirably capable of uniformly dispersing the carbon nanotubes 1 therein. In addition, the solvent used here has to be poorer in affinity for the carbon nanotubes 1 than the surface of the light-transmitting support 3. Examples of such a dispersing solvent include halogenated hydrocarbon solvents having slight polarity at bonds therein. Specific examples of the solvent which can be used as the dispersing solvent include 1,1-dichloroethane, 1,2-dichloroethane, 1,1,1-trichloroethane, trichloroethylene, tetrachloroethylene, bromomethane, o-dichlorobenzene, 1,2,4-trichlorobenzene, chlorobenzene, bromobenzene, and 1,1,2,2-tetrachloroethane.

When the light-transmitting support 3 is immersed in such a carbon nanotube dispersion 11, the difference in affinity ensures that part of the carbon nanotubes 12 dispersed in the dispersing solvent are spontaneously adsorbed onto the surface of the light-transmitting support 3. In this case, the surface density of the carbon nanotubes 13 adsorbed can be easily controlled by appropriately selecting the concentration of the carbon nanotubes 12 in the dispersion 11 and the immersion time.

Figure 2C:
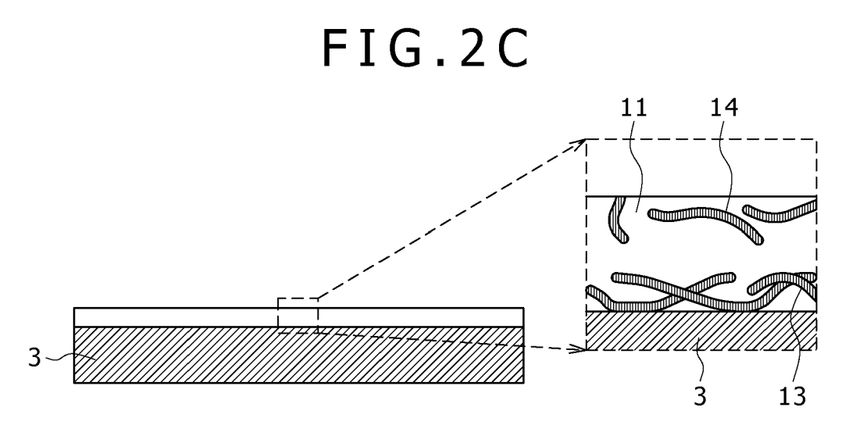
Figure 2D:
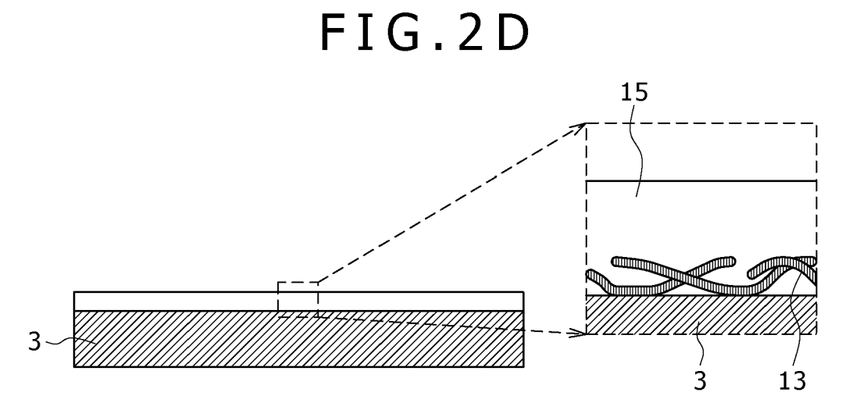

Next, as shown in FIG. 2C, the light-transmitting support 3 is taken out of the dispersion. In this condition, the dispersion 11 in contact with the light-transmitting support 3 contains the carbon nanotubes 14 which are not adsorbed on the light-transmitting support 3. If the dispersing solvent is evaporated under this condition, the non-adsorbed carbon nanotubes 14 are aggregated together, whereby the uniformity of dispersion of the carbon nanotubes is degraded. Taking this into account, as shown in FIG. 2D, the light-transmitting support 3 is washed with a washing solvent 15 so as to remove the non-adsorbed carbon nanotubes 14. When a dispersant and impurities are contained in the dispersion 11, the dispersant and the impurities can also be removed in the washing step. As the washing solvent 15, the same solvent as the dispersing solvent may be used. It is to be noted, however, that when a solvent having high affinity for the dispersant and the impurities is used, the dispersant and the impurities can be removed efficiently.

Figure 2E:
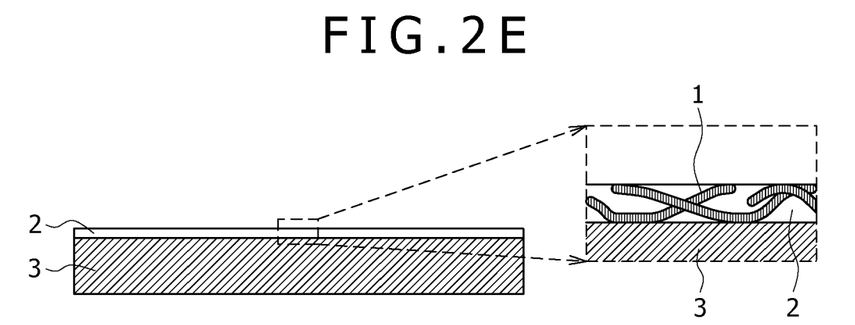

Subsequently, as shown in FIG. 2E, the dispersing solvent and the washing solvent are evaporated off, whereby the carbon nanotubes 13 adsorbed on the surface of the light-transmitting support 3 are fixed to the surface of the light-transmitting support 3, thereby forming a conductive material 2 composed only of the carbon nanotubes 1 thus fixed.

The series of steps including the steps of FIGS. 2B to 2E are repeated a predetermined number of times, as required, to produce a light-transmitting electric conductor 10 showing the electrical conductivity desired.

According to the above-mentioned method, by utilizing the affinity between the carbon nanotubes 1 and the surface of the light-transmitting support 3, part of the carbon nanotubes 12 in the dispersion 11 are spontaneously adsorbed onto the surface of the light-transmitting support 3. In addition, those carbon nanotubes 14 which are not adsorbed are removed in the subsequent washing step. Consequently, only the carbon nanotubes 13 adsorbed on the surface of the light-transmitting support 3 are fixed to the surface. Therefore, unlike in the coating method in which carbon nanotubes are forcibly deposited on a support surface through evaporation of a solvent, the carbon nanotubes in the present method can be uniformly fixed while maintaining the highly dispersed state they have had in the dispersion 11, without aggregation, at the time of evaporation of the solvents.

In addition, unlike in the coating method in which all the carbon nanotubes contained in the dispersion used for coating are deposited, even when the dispersion 11 in the present method contains carbon nanotubes poorly dispersed in the solvent, these carbon nanotubes will not produce a problem unless they are adsorbed on the surface of the light-transmitting support 3. Therefore, the dispersibility (dispersing performance) of the carbon nanotubes 12 in the dispersion 11 may in some cases be lower as compared with that of the carbon nanotubes in the dispersion used in the coating method. This ensures that where an appropriate solvent can be selected, the dispersion 11 can be prepared without use of any dispersant, so that incorporation of a solvent into the conductive material 2 is obviated. Even in the case of using a solvent such that a dispersant is necessary, the amount of the dispersant to be used can be reduced, as compared with the case of the dispersion used in the coating method. Moreover, unlike in the coating method, the dispersant can be removed in the washing step in the present method. Therefore, the dispersant is prevented from remaining in the conductive material 2. Besides, even if the dispersion 11 contains impurities, the impurities will not cause a problem unless they are adsorbed on the surface of the light-transmitting support 3. Further, even if the impurities are adsorbed on the surface, they can be removed in the washing step. Accordingly, the impurities are prevented from remaining in the conductive material 2.

Besides, since the carbon nanotubes 1 constituting the conductive material 2 are bonded to the surface of the light-transmitting support 3 without fail, a situation in which carbon nanotubes not bonded to the surface of the light-transmitting support 3 are stacked in a number of layers is obviated. Therefore, an upper limit naturally exists as to the surface density of the carbon nanotubes constituting the conductive material 2. The surface density of the carbon nanotubes 13 adsorbed on the surface of the light-transmitting support 3 can be easily controlled within a range of not more than the upper limit, by appropriately selecting the concentration of the carbon nanotubes 12 in the dispersion 11, the immersion time, and the number of times of immersion.

Thus, according to the method of manufacturing a light-transmitting electric conductor 10 in the present embodiment, it is possible to form a highly flat conductive material 2 which does not contain a dispersant or impurities and in which the carbon nanotubes 1 are distributed uniformly. Consequently, it is possible to manufacture a light-transmitting electric conductor 10 such that the light-transmitting property, electric conduction characteristics and mechanical characteristics possessed by the carbon nanotubes 1 can be exhibited without being spoiled.

Embodiment 2

In Embodiment 2, mainly, another light-transmitting electric conductor and another method of manufacturing a light-transmitting electric conductor described will be described.

Figure 3:
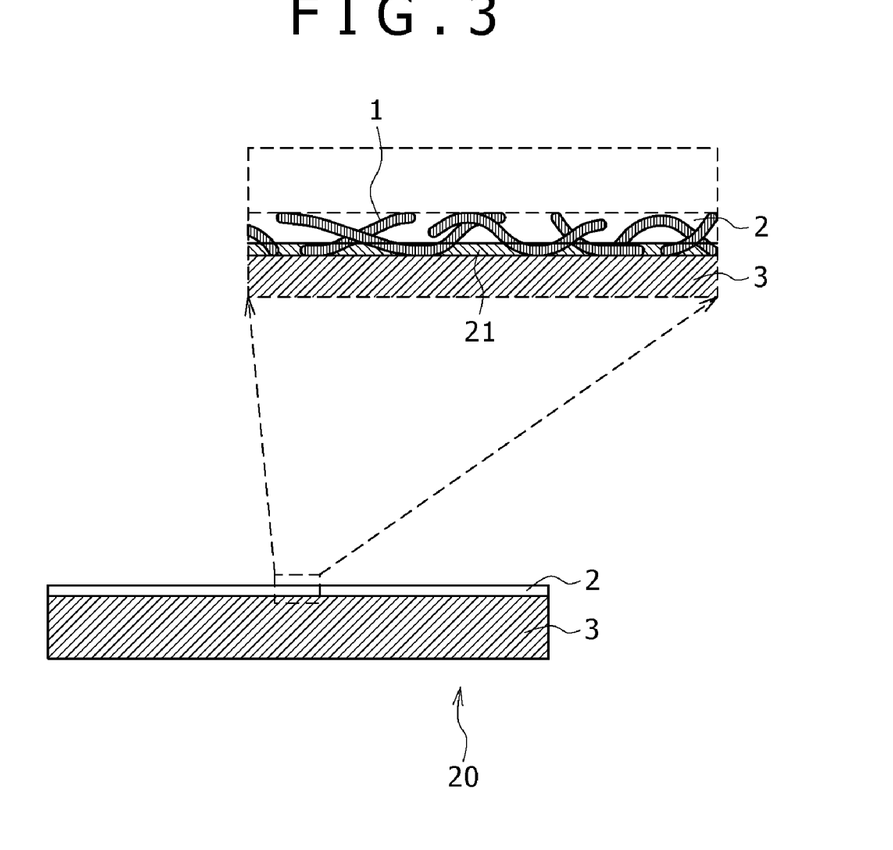
FIG. 3 shows a sectional view and a partial enlarged sectional view illustrating the structure of a light-transmitting electric conductor based on embodiment two.

FIG. 3 shows a sectional view and a partial enlarged sectional view illustrating the structure of a light-transmitting electric conductor 20 based on Embodiment 2. As shown in FIG. 3, in the light-transmitting electric conductor 20, a conductive material 2 is disposed which is composed of carbon nanotubes 1 fixed to a principal surface on one side of a light-transmitting support 3, and a polymer resin layer 21 is provided which covers joints between the surface of the light-transmitting support 3 and the carbon nanotubes 1 making contact with the surface.

The polymer resin layer 21 is a resin layer similar to the urethane acrylate resin layer described in Example 2 of Patent Document 2. For example, after formation of the conductive material 2 composed only of the carbon nanotubes, a solution of a conductive polymer such as PEDOT (poly(3,4-ethylenedioxythiophene)) is applied thereto, so as to cover the joints. In the light-transmitting electric conductor 20, the joints between the surface of the light-transmitting support 3 and the carbon nanotubes 1 are protected by the polymer resin layer 21, and, therefore, mechanical durability is enhanced. The use of PEDOT is desirable because electroconductivity is thereby enhanced though light-transmitting property is a little lowered. Other than this, a dispersion of Nafion (registered trademark; produced by Du Pont Kabushiki Kaisha) or polyvinylidene fluoride in an appropriate solvent may be applied.

Embodiment 3

In Embodiment 3, mainly, an electronic device configured as a touch panel will be described as an example of the electronic device provided with a light-transmitting electric conductor.

Figure 4:
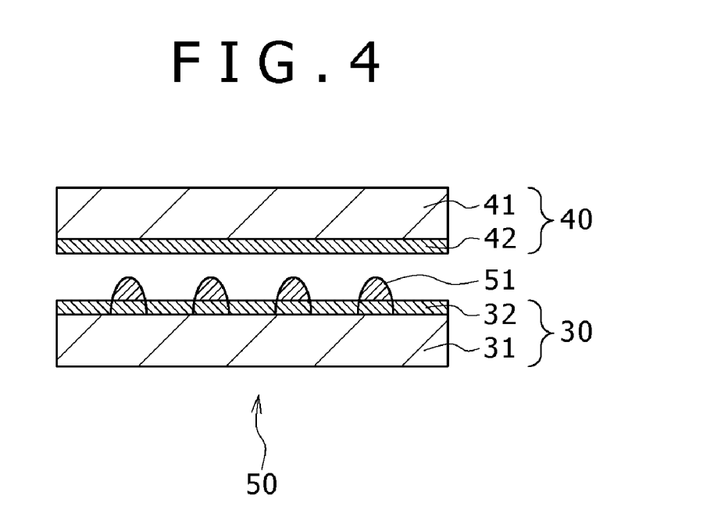
FIG. 4 is a sectional view illustrating the structure of a touch panel based on embodiment three.

FIG. 4 is a sectional view showing the structure of a touch panel 50 based on Embodiment 3. The touch panel 50 is a resistive film type touch panel, wherein a light-transmitting electric conductor 30 having a transparent conductive film 32 provided on a light-transmitting support 31 and a light-transmitting electric conductor 40 having a transparent conductive film 42 provided on a light-transmitting support 41 are arranged so that the transparent conductive film 32 and the transparent conductive film 42 face each other.

For example, the light-transmitting support 31 is a glass substrate, and the light-transmitting support 41 is a transparent polymer resin film such as a PET film. Both the light-transmitting support 31 and the light-transmitting support 41 may be composed of transparent polymer resin films, and, in that case, a touch panel having a flexible panel surface can be formed.

At normal times when the light-transmitting electric conductor 40 is not pressed, the transparent conductive film 32 and the transparent conductive film 42 are spaced from each other by spacers 51. When the light-transmitting electric conductor 40 is touched (pressed) strongly, the light-transmitting support 41 and the transparent conductive film 42 are bent so that the transparent conductive film 32 and the transparent conductive film 42 come into contact with each other at the position of the touch, and coordinate information on the touch position is detected from the resistance value in this condition.

As a characteristic feature in this embodiment, the light-transmitting electric conductor 40 is, or both the light-transmitting electric conductor 30 and the light-transmitting electric conductor 40 are each, the light-transmitting electric conductor 10 described in Embodiment 1 above; besides, the transparent conductive film 42 is, or both the transparent conductive film 32 and the transparent conductive film 42 are each, the conductive material 2 composed of carbon nanotubes. The conductive material 2 is high in light transmittance and in uniformity of sheet resistance, and has mechanical characteristics of good flexibility and toughness. As a result, the touch panel 50 based on this embodiment is high in light transmittance and in position detection accuracy, and has high durability and reliability.

EXAMPLES

Now, the light-transmitting electric conductor and the manufacturing method therefor described in Embodiment 1 above will be described more in detail below referring to Examples, which are not to be construed as limitative of embodiments of the present application.

Examples 1 to 5

Fabrication of Light-Transmitting Electric Conductor

Single-wall carbon nanotubes were synthesized by the laser ablation method. The single-wall carbon nanotubes were subjected to an oxidizing treatment by use of an aqueous 30 mass % solution of hydrogen peroxide at 100° C. for eight hours, followed by washing with pure water and drying.

The single-wall carbon nanotubes thus produced were added to o-dichlorobenzene so as to attain a predetermined concentration, and ultrasonic waves were applied thereto by use of an ultrasonic cleaner, to prepare a uniform dispersion of the carbon nanotubes in o-dichlorobenzene.

A surface of a 188 μm-thick PET film was cleaned by use of acetone. Subsequently, a surface treatment for enhancing hydrophilicity by irradiation with ultraviolet rays in the presence of an ozone gas was applied to the surface of the PET film by use of an ultraviolet (UV)/ozone irradiation apparatus for 20 minutes. Thereafter, the PET film was immediately immersed in the carbon nanotube dispersion prepared beforehand.

After the immersion was continued for a predetermined time, the PET film was taken out of the carbon nanotube dispersion. Immediately thereafter, the PET film was rinsed and washed with an acetone solvent for about ten seconds, whereby the dispersing solvent and surplus deposits were removed therefrom. Thereafter, the solvents were evaporated by air-blow, followed by heating at 100° C. for five minutes, to completely evaporate off the remaining solvents.

<Evaluation of Light-Transmitting Electric Conductor Fabricated>

The light-transmitting electric conductors fabricated above were served to measurement of total light transmittance. In addition, the light-transmitting electric conductors were served to measurement of sheet resistance by use of a four-terminal sheet resistance measuring instrument. Further, the surface conditions of the light-transmitting electric conductors were observed by use of an atomic force microscope (AFM).

In Examples 1 to 5, variations in visible light transmittance and sheet resistance upon variations in the concentration of carbon nanotubes in the dispersion and the immersion time were evaluated. The characteristics of the light-transmitting electric conductors thus obtained are shown in Table 1. Incidentally, the visible light transmittance in Table 1 is the transmittance for light of a wavelength of 550 nm, which was used as a representative of the whole visible light. In addition, the transmittance of the PET film, used as the light-transmitting support, alone for light of a wavelength of 550 nm is 89%; taking it into account, therefore, the transmittance of the conductive material, composed of the carbon nanotubes, alone is estimated as 97 to 100%.

Examples 6 to 10

Single-wall carbon nanotube manufactured by the HiPco method was purchased from Carbon Nanotechnologies, Inc. The single-wall carbon nanotubes were added to 1,1,2,2-tetrachloroethane to attain a predetermined concentration, and then ultrasonic waves were applied thereto by use of an ultrasonic cleaner for two hours, to prepare a uniform dispersion of the single-wall carbon nanotubes in 1,1,2,2-tetrachloroethane. Light-transmitting electric conductors were fabricated in the same manner as in Examples 1 to 5, except for the just-mentioned preparation of the dispersion, and were served to evaluation of characteristics. The results are shown in Table 1.

TABLE 1

|  | CNT production method | Conc. of CNT in dispersion (g/L) | Immersion time | Visible light transmittance (%) | Sheet resistance (kΩ/□) |
| --- | --- | --- | --- | --- | --- |
| Example 1 | Laser ablation method | 0.1 | 10 sec | 88.0 | 8 |
| Example 2 |  | 0.01 | 10 sec | 88.5 | 110 |
| Example 3 |  | 0.1 | 60 sec | 87.0 | 4 |
| Example 4 |  | 0.01 | 60 sec | 88.0 | 11 |
| Example 5 |  | 0.2 | 10 min | 86.5 | 3 |
| Example 6 | HiPco method | 0.1 | 10 sec | 88.0 | 32 |
| Example 7 |  | 0.01 | 10 sec | 89.0 | 300 |
| Example 8 |  | 0.1 | 60 sec | 87.5 | 21 |
| Example 9 |  | 0.01 | 60 sec | 88.0 | 21 |
| Example 10 |  | 0.2 | 10 min | 87.0 | 12 |

Figure 5:
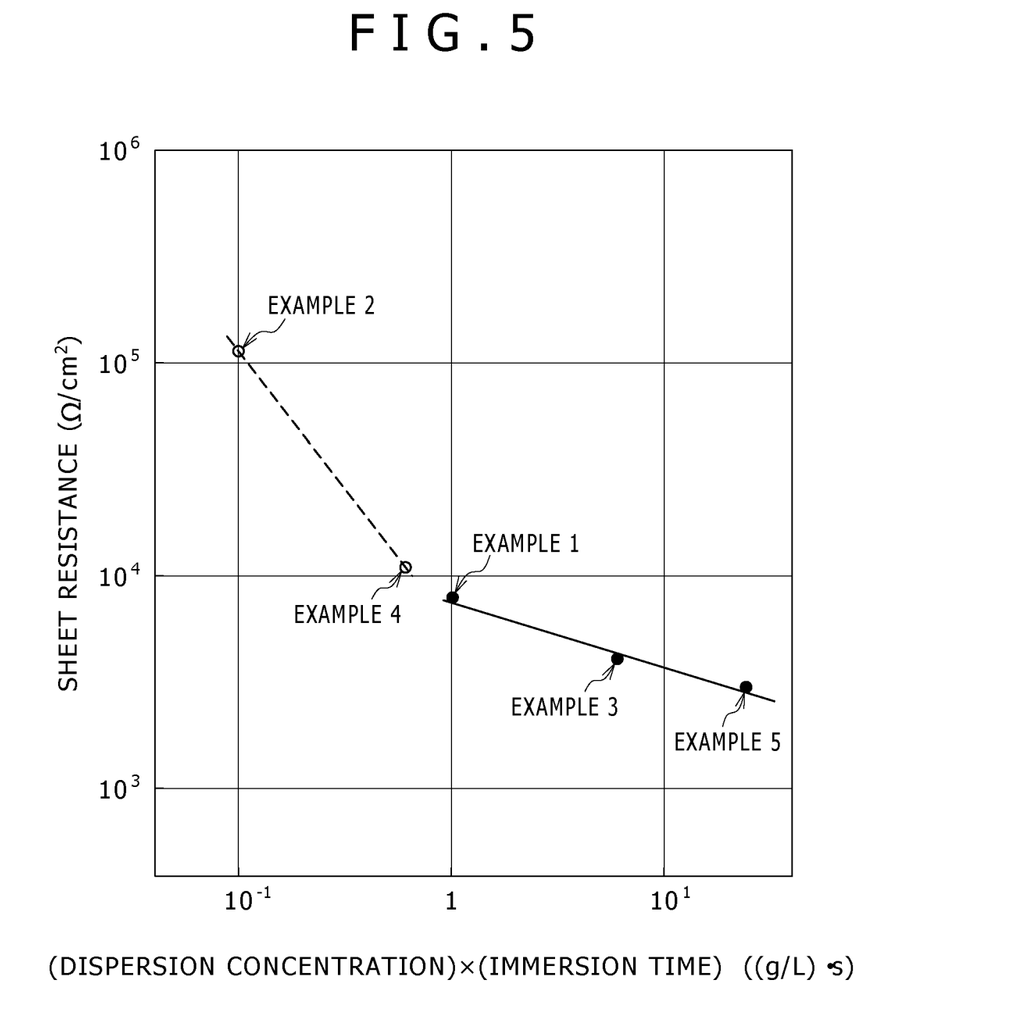
FIG. 5 is a graph showing the relationship between the product of the concentration of carbon nanotubes in a dispersion and immersion time, and sheet resistance of a light-transmitting electric conductor obtained, in Examples 1 to 5 of an embodiment.

FIG. 5 is a graph showing the relationship between the product of the concentration of carbon nanotubes in the dispersion and immersion time, and sheet resistance of the light-transmitting electric conductor obtained, in Examples 1 to 5. As seen, the points corresponding to the logarithms of the product and the sheet resistance are on one straight line in the case where the concentration of the carbon nanotubes in the dispersion is 0.01 g/L, and the points are on another straight line in the case where the concentration is 0.1 g/L or 0.2 g/L, but the points in both the cases show the same tendency. Besides, the points do not show a saturating tendency of the amount of carbon nanotubes deposited. Therefore, it is considered that the sheet resistance can be further lowered by increasing the concentration of carbon nanotubes in the dispersion or the immersion time. The same tendency as this was observed also in Examples 6 to 10.

Figure 6:
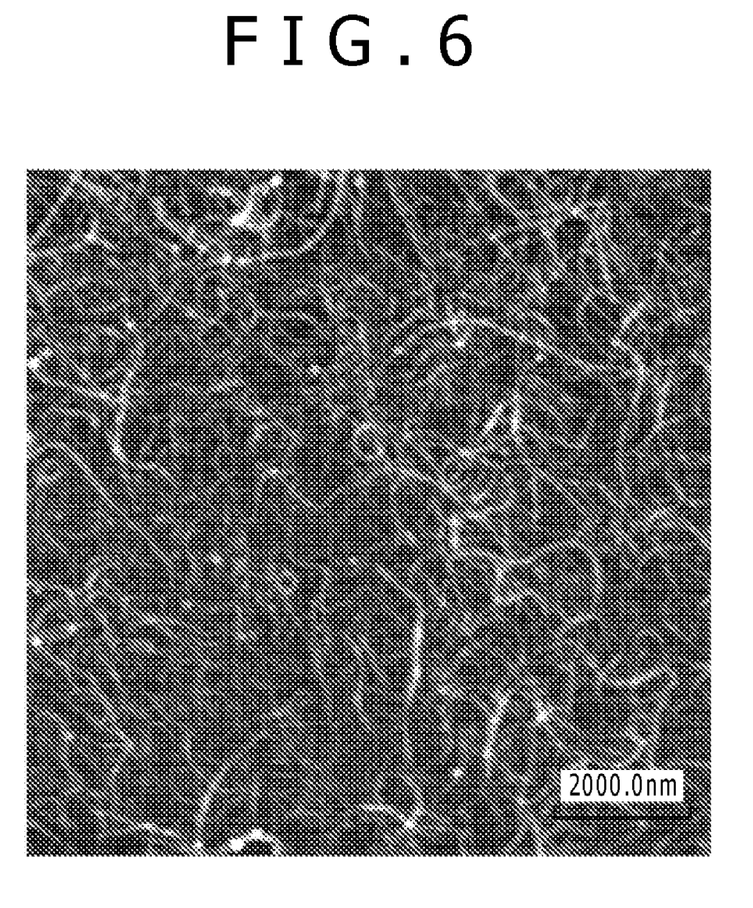
FIG. 6 shows an image observed under AFM (atomic force microscope) of the surface of the light-transmitting electric conductor obtained in Example 3 of an embodiment.

FIG. 6 shows an image observed under AFM of the surface of the light-transmitting electric conductor obtained in Example 3. It is seen from FIG. 6 that the carbon nanotubes, in thin bundles, are deposited uniformly on the substrate surface, on which impurities (other substances than the carbon nanotubes) are little deposited.

Incidentally, in the cases where the carbon nanotube dispersions were prepared by adding a dispersant, adsorption of the carbon nanotubes on the PET film would not take place even if the PET film was immersed in the dispersions in the same manner as in Examples. Also, in the case where a PET film not subjected to the surface treatment was immersed in the same carbon nanotube dispersions used in Examples, adsorption of the carbon nanotubes on the PET film did not take place.

The light-transmitting electric conductors fabricated in Examples 1 to 10 have a sheet resistance of 10 to 1,000,000Ω/□ and a visible light transmittance of not less than 70%. In addition, the in-plane scattering of sheet resistance values is not particularly limited, and is within ±10% of the mean value, for example. When such characteristics are maintained, the conductive material can be used widely as a transparent electrode or a transparent conductive film.

The light-transmitting electric conductor according to an embodiment can contribute to enhancement of the functions of transparent conductive films and transparent electrodes, which are expected to become of increasing importance from now on. In addition, the light-transmitting electric conductor can be used for electronic devices involving entrance/exit of light, such as liquid crystal displays and touch panels, and for light-transmitting members on which deposition of dust is undesirable, such as partitions in clean rooms, thereby contributing to enhancement of functions of, and spreading of, these devices and members.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:
1. A light-transmitting electric conductor comprising, on a surface of a light-transmitting support:
   a conductive material in which a multiplicity of carbon nanolinear structures are accumulated in two dimensions while making partial contact with each other,
   wherein said conductive material is a light-transmitting conductive material composed of said carbon nanolinear structures, and direct bonds are formed between said surface of said light-transmitting support and said carbon nanolinear structures making contact with said surface without the carbon nanolinear structures being buried in the light-transmitting support, and between said carbon nanolinear structures making contact with each other.

2. The light-transmitting electric conductor according to claim 1, wherein said carbon nanolinear structures are overlapping partly with each other as viewed in the vertical direction.

3. The light-transmitting electric conductor according to claim wherein said carbon nanolinear structure is carbon nanotube.

4. The light-transmitting electric conductor according to claim 1, wherein said light-transmitting support is a glass plate or a polymer resin plate.

5. The light-transmitting electric conductor according to claim 4, wherein said surface of said light-transmitting support has been subjected to a treatment for enhancing affinity for said carbon nanolinear structures.

6. The light-transmitting electric conductor according to claim 5, wherein said light-transmitting support is a glass plate having a surface enhanced in hydrophilicity by at least one of an ozone treatment, an ultraviolet treatment in the presence of an ozone gas, and a plasma treatment in the presence of an oxygen gas.

7. The light-transmitting electric conductor according to claim 5, wherein said light-transmitting support is a polymer resin plate which has a surface made hydrophilic by at least one of an ozone treatment, an ultraviolet treatment in the presence of an ozone gas, a corona treatment in the presence of an oxygen gas, a plasma treatment in the presence of an oxygen gas, and a treatment with a silane coupling agent, or which is provided with a hydrophilic layer on a surface thereof.

8. The light-transmitting electric conductor according to claim 1, wherein said carbon nanolinear structures have been subjected to a treatment for enhancing affinity for said surface of said light-transmitting support.

9. The light-transmitting electric conductor according to claim 8, wherein said carbon nanolinear structures have been made hydrophilic by a heating treatment with at least one of an aqueous hydrogen peroxide solution, nitric acid, and concentrated sulfuric acid.

10. The light-transmitting electric conductor according to claim 1, wherein said conductive material has a sheet resistance of 10 to 300,000Ω/☐ and a visible light transmittance of not less than 70%.

11. The light-transmitting electric conductor according to claim 1, further comprising a polymer resin layer covering joints between said surface of said light-transmitting support and said carbon nanolinear structures making contact with said surface.

12. The light-transmitting electric conductor according to claim 1, wherein said conductive material forms a transparent electrode.

13. A method of manufacturing a light-transmitting electric conductor,
said light-transmitting electric conductor including, on a surface of a light-transmitting support,
a conductive material in which a multiplicity of carbon nanolinear structures are accumulated in two dimensions while making partial contact with each other,
said conductive material being a light-transmitting conductive material composed only of said carbon nanolinear structures, and direct bonds being formed between said surface of said light-transmitting support and said carbon nanolinear structures making contact with said surface without the carbon nanolinear structures being buried in the light-transmitting support, and between said carbon nanolinear structures making contact with each other,
wherein said method includes performing a series of steps a predetermined number of times, the method comprising:
immersing said light-transmitting support in a dispersion of said carbon nanolinear structures in a dispersing solvent for a predetermined time so as to adsorb said carbon nanolinear structures onto said surface of said light-transmitting support;
washing said surface of said light-transmitting support, taken out of said dispersion, with a washing solvent so as to remove those carbon nanolinear structures which are not adsorbed on said surface; and
evaporating said dispersing solvent and said washing solvent so as to fix said adsorbed carbon nanolinear structures.

14. The method according to claim 13, wherein carbon nanotube is used as said carbon nanolinear structure.

15. The method according to claim 13, wherein a halogenated hydrocarbon is used as said dispersing solvent.

16. The method according to claim 13, wherein a glass plate or a polymer resin plate is used as said light-transmitting support.

17. The method according to claim 16, wherein said surface of said light-transmitting support is subjected to a treatment for enhancing affinity for said carbon nanolinear structures.

18. The method according to claim 17, wherein a glass substrate is used as said light-transmitting support, and hydrophilicity of a surface of said glass substrate is enhanced by at least one of an ozone treatment, an ultraviolet treatment in the presence of an ozone gas, and a plasma treatment in the presence of an oxygen gas.

19. The method according to claim 17, wherein a polymer resin plate is used as said light-transmitting support, and a surface of said polymer resin plate is made hydrophilic by at least one of an ozone treatment, an ultraviolet treatment in the presence of an ozone gas, a corona treatment in the presence of an oxygen gas, a plasma treatment in the presence of an oxygen gas, and a treatment with a silane coupling agent, or a hydrophilic layer is formed on a surface of said polymer resin plate.

20. The method according to claim 13, in which said carbon nanolinear structures are subjected to a treatment for enhancing affinity for said surface of said light-transmitting support.

21. The method according to claim 20, wherein said carbon nanolinear structures are made hydrophilic by a heating treatment with at least one of an aqueous hydrogen peroxide solution, nitric acid, and concentrated sulfuric acid.

22. The method according to claim 13, further comprising:
providing a polymer resin layer covering joints between said surface of said light-transmitting support and said carbon nanolinear structures making contact with said surface.

23. A destaticizing sheet comprising a light-transmitting electric conductor including on a surface of a light-transmitting support:
a conductive material in which a multiplicity of carbon nanolinear structures are accumulated in two dimensions while making partial contact with each other, wherein said conductive material is a light-transmitting conductive material composed of said carbon nanolinear structures, and direct bonds are formed between said surface of said light-transmitting support and said carbon nanolinear structures making contact with said surface without the carbon nanolinear structures being buried in the light-transmitting support, and between said carbon nanolinear structures making contact with each other.

24. An electronic device provided with a light-transmitting electric conductor including, on a surface of a light-transmitting support:

a conductive material in which a multiplicity of carbon nanolinear structures are accumulated in two dimensions while making partial contact with each other, wherein said conductive material is a light-transmitting conductive material composed of said carbon nanolinear structures, and direct bonds are formed between said surface of said light-transmitting support and said carbon nanolinear structures making contact with said surface without the carbon nanolinear structures being buried in the light-transmitting support, and between said carbon nanolinear structures making contact with each other.

25. The electronic device according to claim 24, wherein said conductive material forms a transparent electrode.

26. The electronic device according to claim 24, configured as a substance sensor wherein said conductive material forms a sensor section.

27. The electronic device according to claim 24, wherein said conductive material constitutes a thin film transistor.

* * * * *